United States Patent [19]

Owada et al.

[11] Patent Number: 4,544,934

[45] Date of Patent: Oct. 1, 1985

[54] DRIVING CIRCUIT FOR AN ELECTROSTATIC RECORDING HEAD

[75] Inventors: Fumio Owada, Hachioji; Yoshiko Yamaguchi, Tondabayashi, both of Japan

[73] Assignee: Tokyo Shibaura Denki Kabushiki Kaisha, Kawasaki, Japan

[21] Appl. No.: 513,027

[22] Filed: Jul. 12, 1983

[30] Foreign Application Priority Data

Aug. 26, 1982 [JP]  Japan ................. 57-148250

[51] Int. Cl.$^4$ ................. G01D 15/06; H03K 17/00
[52] U.S. Cl. ................. 346/154; 307/255; 307/270
[58] Field of Search .......... 346/153.1, 154, 155; 358/300; 307/255, 270, 280, 300

[56] References Cited

U.S. PATENT DOCUMENTS 3,751,682  8/1973  Howe ................. 307/255

Primary Examiner—E. A. Goldberg
Assistant Examiner—Fred L. Kampe
Attorney, Agent, or Firm—Banner, Birch, McKie & Beckett

[57] ABSTRACT

The invention is a driving circuit for an electrostatic recording head which reduces the turn-on time, the storage time and the turn-off time of the driving circuit output pulses. Mutually complementary first and second transistors are connected with their collectors in common. A first driving signal is supplied via a coupling capacitor to the base of the first transistor, and is also supplied to the base of the second transistor. High voltage is supplied to the emitter of the first transistor. The output signal is obtained from the interconnection of the common collectors. The first driving signal has three sequential levels, two of which occur within the time period when the recording picture signals are supplied. The first level $e_2$ is the highest and occurs during the beginning portion of the recording signal and the second level $e_1$ is lower than $e_2$ and occurs during the remaining portion of the recording signal. The third level is the smallest (i.e., zero or ground level (o)) and occurs immediately after $e_1$ when no recording signals are supplied. A second driving signal is applied to the emitter of the second transistor. The second driving signal has two non-zero sequential levels (i.e., $e_4$ and $e_3$). The first level $e_4$ is the larger of the two and occurs at the end of $e_1$ and continues for a time approximately equal to or greater than $T_c$. The second level $e_3$ occurs immediately after $e_4$.

9 Claims, 10 Drawing Figures

DRIVING CIRCUIT FOR AN ELECTROSTATIC RECORDING HEAD

BACKGROUND OF THE INVENTION

1. Field of the Invention

This invention relates to a driving circuit for an electrostatic recording head used in electrostatic recording such as facsimile or other printing systems.

2. Description of the Prior Art

By using electrostatic recording, high speed and high quality recording is possible; consequently, electrostatic recording is generally used in various recording equipment in which high speed and high quality is required.

The principle of electrostatic recording incorporates electrodes for producing electric discharges which create electrostatic charge patterns forming electrostatic latent images on an electrostatic recording medium. Colored powder particles, charged to an opposite polarity (i.e., toner), are then sprinkled over the electrostatic images for developing the image. Finally, the toner is fixed by heating and recording is thereby accomplished. The composite electrodes which form the electrostatic latent images are called an electrostatic recording head. One of the most popular electrostatic recording heads is a multistylus head. FIG. 1 shows one example of a multistylus head having a base BB. A stylus electrode row SE, comprising several stylus electrodes arranged in a row, are disposed on base BB. On each side of electrode row SE are respective rows of control electrodes $CE_1$, $CE_2$, also embedded in base BB. During recording, a high voltage pulse, supplied from a driving circuit, is impressed between the stylus electrode and each of the control electrodes. As a result, electrostatic latent images are formed on an electrostatic recording medium (not shown). In the above description, reference is made to a multistylus head with respective control electrode rows $CE_1$, $CE_2$ on each side of stylus electrode row SE. There are, however, recording heads which have no control electrodes. For example, spaced from the head is a surface at ground potential permitting charges to be formed on a paper positioned between the head and the ground potential. In any case, a electrostatic recording head has at least one electrode for forming electostatic latent images on an electrostatic recording medium. A driving circuit for generating high voltage pulses is coupled to this electrode. The present invention relates to such a circuit.

FIG. 2 shows a conventional driving circuit for an electrostatic recording head. A driving circuit is provided for each electrode of the recording head. A driving signal indicating whether a high voltage pulse is to be supplied to the corresponding electrode is supplied to an input terminal 1. This signal is supplied, via a coupling capacitor $C_1$ and an input resistor $R_1$, to the base of a transistor $TR_1$. A power source (not shown) supplies $-E$ voltage to the emitter of $TR_1$. If the level of the driving signal is high, transistor $TR_1$ turns ON and the high voltage $-E$ is supplied to an output terminal 3 through a resistor $R_4$ which controls the output current. In this conventional circuit, resistor $R_2$ is a base breeder resistor and resistor $R_3$ is a collector resistor.

FIGS. 3a and 3b show the waveforms of the input signal IN supplied to terminal 1 and the output signal OUT from terminal 3 of the circuit shown in FIG. 2. W represents the time period (i.e., recording time period) the recording signals are supplied to the circuit. In these figures, time $T_a$ is the turn-on delay time and time $T_b$ is the storage time and time $T_c$ is the turn-off time of transistor $TR_1$, respectively. The turn-off delay time is the sum of $T_b$ and $T_c$. Such delays are undesirable in electrostatic driving circuits since printing speed is adversely effected and ghosts are produced during printing. In order to speed up the response of this driving circuit, it is desirable to shorten turn-on time $T_a$, storage time $T_b$ and turn-off time $T_c$. For example, if turn-on time $T_a$ is substantially long as compared with the pulse width W, the output will not sufficiently rise within the impressing time of the input signal. If either storage time $T_b$ or turn-off time $T_c$ is substantially long, one driving signal output will overlap with its next adjacent driving signal output; as a result, noise occurs producing ghosts which appear in the recorded image. In the circuit shown in FIG. 2, turn-on time $T_a$ can be shortened by increasing the current supplied to the base of $TR_1$. However, if the base current is increased, storage time $T_b$ will concomitantly increase. Therefore, in order to shorten both time $T_a$ and time $T_b$, the value of the base current must be compromised. The delay in turn-off time $T_c$ is caused by the inherent capacitance of the collector of transistor $TR_1$ and the capacitance between the electrodes of the load (not shown). Time $T_c$ can be shortened by reducing the collector resistor $R_3$. However, in doing this, the current capacity of high voltage source E must be increased. Increasing the capacity of the power source is very impractical and expensive, thus sufficient high-speed action cannot be obtained from the circuit shown in FIG. 2.

Another conventional circuit which attempts to reduce turn-off time $T_c$ is the circuit shown in FIG. 4. In FIG. 4, a circuit comprising transistor $TR_2$ and diode $CD_1$ is added to the collector of transistor $TR_1$ of the circuit shown in FIG. 2; the other elements of this circuit are the same as shown in FIG. 2. In this circuit, during the time the collector voltage of transistor $TR_1$ rises to 0V, transistor $TR_2$ operates as emitter-follower, driving the capacitance which exists between the load electrodes. During this time, the low impedance between the emitter-collector of $TR_2$ discharges the capacitor between the electrodes and by-passes resistor $R_3$. Consequently, the adverse effect caused by collector resistor $R_3$ and the load capacitor is reduced. Diode $CD_1$ is needed to permit current flow to the load during times $T_a$ and $T_b$ so the capacitor between the electrodes can charge during those times. This circuit design, however, does not improve time $T_a$ and $T_b$. Moreover, the effect on turn-off time $T_c$ caused by the inherent collector capacitor of transistor $TR_1$ is also not improved. Rather, this circuit design only reduces the effect caused by the capacitance between the electrodes.

A further conventional circuit which attempts to reduce the current capacity of the source while permitting reduction of turn-off time $T_c$ is the circuit shown in FIG. 5. In this circuit, a transistor $TR_3$ which is complementary to transistor $TR_1$ is utilized. The collector of $TR_3$ is connected via output resistors $R_{41}$, $R_{42}$ to the collector of transistor $TR_1$. The emitter of transistor $TR_3$ is grounded, and its base is connected via a resistor $R_5$ to input terminal 1. The connecting point between rsistors $R_{41}$, $R_{42}$ is connected to the output terminal 3. A resistor $R_6$ is a base breeder resistor for transistor $TR_3$.

In this circuit, transistor $TR_3$ is on during the time transistor $TR_1$ is off, and is off during the time transistor $TR_1$ is on. That is, during the time transistor $TR_1$ is on, collector current does not flow in transistor $TR_1$ via transistor TR$_2$. Collector current of TR$_1$, however, flows via output resistors R$_{41}$ to the load capacitor only when it is being charged. Likewise, the collector current of TR$_3$ flows via resistor R$_{42}$ from the load capacitor when it is being discharged. Thus, when transistor TR$_1$ is on, there is no additional current flow from ground via TR$_3$ through TR$_1$; likewise, when TR$_3$ is on, there is no additional current flow from ground via TR$_3$ through TR$_1$. Accordingly, it is not necessary for the high voltage source to supply the additional current; rather, it must supply only the charging or discharging current. Accordingly, the capacity of the high voltage source can be reduced. The discharging path of the capacitor load through TR$_3$ has a low resistance path substantially the same as the current of FIG. 4; consequently, T$_c$ is reduced. Furthermore, the problem of turn-off time due to the collector capacitor of transistor TR$_1$, the problem encountered with the circuit of FIG. 4, is improved because a collector resistor R$_3$ is not utilized. That is, the charges collected in the collector capacitor of transistor TR$_1$ is discharged via output resistor R$_{42}$ and transistor TR$_3$; thus turn-off time T$_c$ due to the collector capacitor of transistor TR$_1$ is shortened. However, this circuit, like the circuit of FIG. 4, has a turn-on time T$_a$ and storage time T$_b$ whichare not improved.

SUMMARY OF THE INVENTION

An object of the invention is to provide a driving circuit for an electrostatic recording head which overcomes the disadvantages of the prior art circuits.

An object of the invention is to provide a driving circuit for an electrostatic recording head wherein turn-on time and storage time, in addition to turn-off time, are shortened.

Another object of the invention is to provide a driving circuit for an electrostatic recording head in which high-speed operation is provided.

A further object of the invention is to provide a driving circuit for an electrostatic recording head which accomplishes the above-mentioned objects in a practical manner without excessive manufacturing costs.

A still further object of the present invention is to provide a driving circuit which substantially eliminates ghosts.

Another object of the present inention is to provide a driving circuit which utilizes a source having a small current capacity.

In this invention, mutually complementary first and second transistors are connected with their collectors in common. A first driving signal is supplied via a coupling capacitor to the base of the first transistor, and is also supplied to the base of the second transistor. High voltage is supplied to the emitter of the first transistor. The output signal is obtained from the interconnection of the common collectors. The first driving signal has three sequential levels, two of which occur within the time period when the recording picture signals are supplied. The first level e$_2$ is the highest and occurs during the beginning portion of the recording signal and the second level e$_1$ is lower than e$_2$ and occurs during the remaining portion of the recording signal. The third level is the smallest (i.e., zero or ground level (0)) and occurs immediately after e$_1$ when no recording signals are supplied. The second driving signal has two non-zero sequential levels (i.e., e$_4$ and e$_3$). The first level e$_4$ is the larger of the two and occurs at the end of e$_1$ and continues for a time approximately equal to or greater than T$_c$. The second level e$_3$ occurs immediately after e$_4$.

In another embodiment of this invention, a plurality of driving circuits are coupled together in a fashion to permit the first driving signals to be easily generated for each circuit and appropriately supplied from two respective sources. Each driving circuit of this embodiment is the same as that used for the previous embodiment except that the input terminal receiving the first driving signal includes a parallel circuit path for receiving a third signal. The third signal has either a zero level (i.e., ground) or an open circuit condition. Consequently, if a zero level is supplied, then the driving circuit will interpret this to mean that no recording signals are supplied to the input terminal. On the other hand, if an open circuit is maintained, then the driving circuit will have the first driving signals representing recording signals supplied to its input.

The plurality of driving circuits are connected in parallel with each circuit receiving at its input terminal the first and second driving signals from respective single sources. Selected driving circuits are then energized by merely supplying the open circuit condition of respective third driving signals to the parallel input terminal. The other driving circuits which will not be energized are then supplied with the ground condition of respective third driving signals.

DESCRIPTION OF THE PREFERRED EMBODIMENTS

Figure 1:
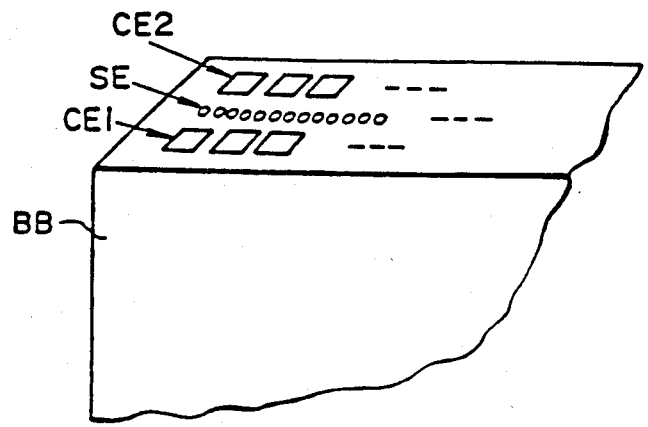
FIG. 1 is a perspective view of an electrostatic recording head.
Figure 2:
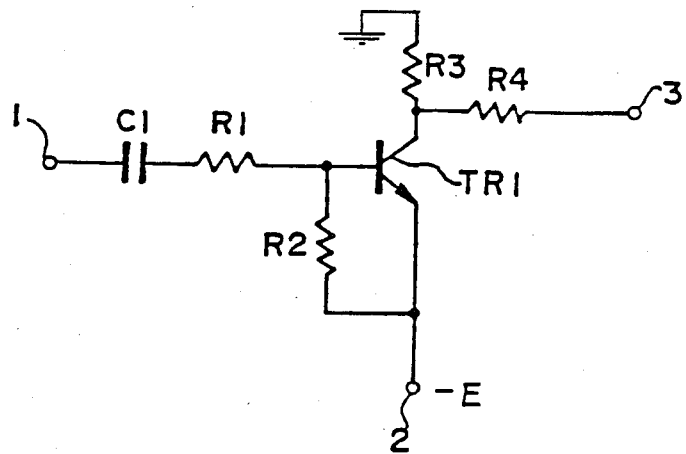
FIG. 2 is a schematic diagram of a conventional driving circuit for an electrostatic recording head.
Figure 3:
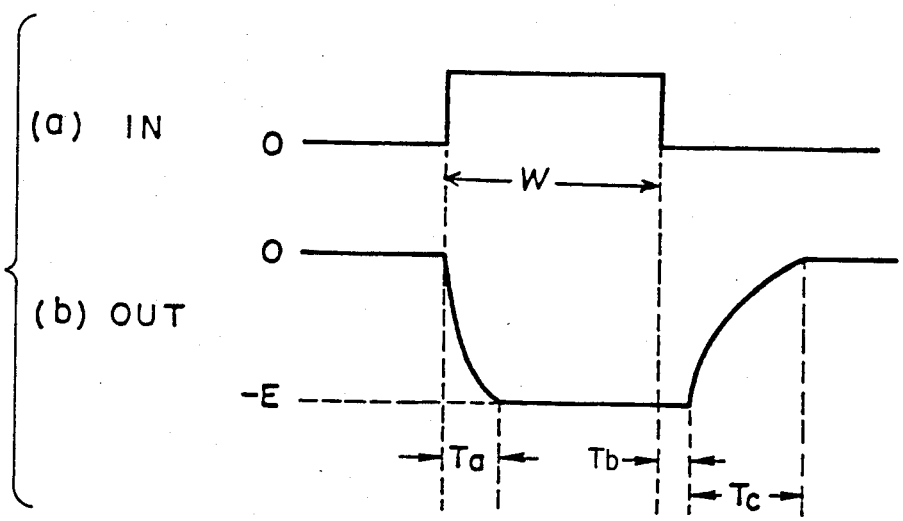
FIG. 3 shows input and output waveforms for the driving circuit shown in FIG. 2.
Figure 4:
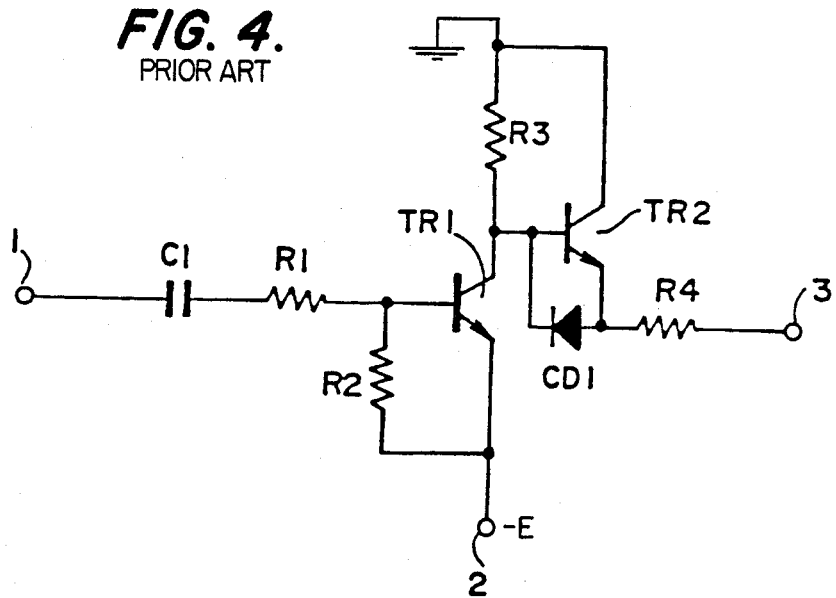
FIGS. 4 and 5 are schematic diagrams of other conventional driving circuits for electrostatic recording heads.

Referring now to the drawings, the embodiments of the invention will now be explained.

Figure 5:
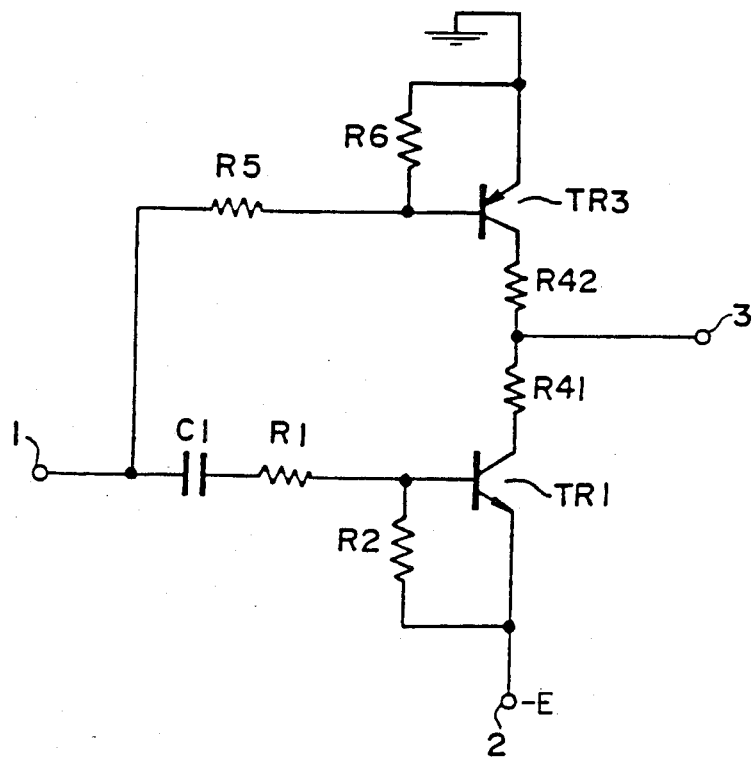
Figure 6:
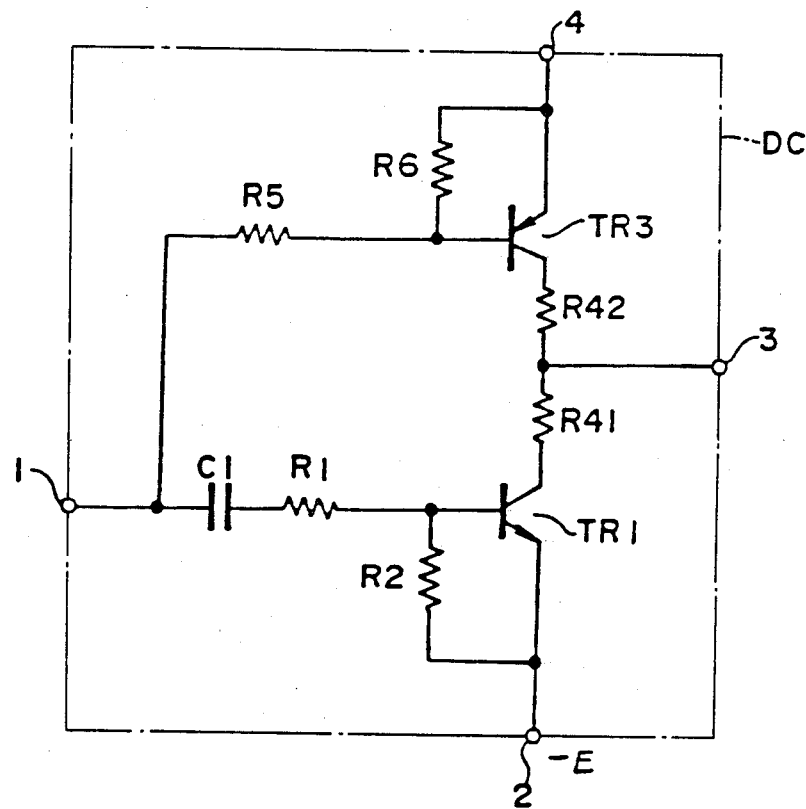
FIG. 6 is a schematic diagram of one embodiment of the present invention.

FIG. 6 shows an embodiment of a driving circuit DC incorporating this invention. This circuit is principally the same as that shown in FIG. 5 except that the emitter of transistor TR$_3$ forms a second input terminal and receives a second driving signal instead of being grounded. As shown, the collector of a NPN type transistor TR$_1$ and the collector of a PNP type transistor TR$_3$ are connected via output resistors R$_{41}$ and R$_{42}$, respectively, to an output terminal 3. A first driving signal is supplied to an input terminal 1 and is coupled via condenser C$_1$ and resistor R$_1$ to the base of transistor TR$_1$. This first driving signal is also supplied via resistor R$_5$ to the base of transistor TR$_3$. The emitter of transistor TR$_3$ is connected to second input terminal 4 for receiving the second driving signal. Resistors $R_2$ and $R_6$ are base breeder resistors for transistors $TR_1$ and $TR_3$, respectively.

The first driving signal is shown in FIG. 7(a). As shown, it has two levels $e_1$ and $e_2$ which occur during the time period W when the recording picture signals are supplied to input terminal 1. The driving signal also has a third level (i.e., zero or ground level) and immediately occurs after period W when no recording signals are supplied. The first level $e_2$ is the highest and occurs during the beginning portion of the recording signal; the second level $e_1$ is lower than $e_2$ and occurs during the remaining portion of period W. As shown in FIG. 7(a), the relationship between these three levels are:

$$e_2 >> e_1 > 0$$

During level $e_2$, transistor $TR_1$ is overdriven; consequently, its turn on time is shortened and the load capacitor is rapidly charged. During level $e_1$, only minimum driving is needed to maintain transistor $TR_1$ in an on state. Thus, level $e_1$ can be made much smaller than $e_2$. Since no direct-current will flow in the load during steady state, collector current will not flow in transistor $TR_1$ during level $e_1$; practically, however, only a small base current is needed at this level to maintain transistor $TR_1$ in an on state and to maintain the voltage charge of the load capacitor. The level of $e_1$ should be sufficient to maintain this small base current. For example, $e_1$ is +2.0 volts, while $e_2$ is +12.0 volts. After levels $e_2$ and $e_1$ of the recording picture signal are supplied, the first driving signal returns to 0 volts (i.e., third level) and transistor $TR_1$ rapidly returns to the off state. At this time, excess carriers, caused by the previous overdriving, collect in the base area and are sufficiently attenuated by the minimum driving during $e_1$. Consequently, the value of storage time $T_b$ will become very small.

Shown in FIG. 7(b) is the second driving signal which consists of two non-zero sequential levels. The first level $e_4$ is the larger of the two and occurs at the end of $e_1$ and continues for a time approximately equal to or greater than $T_c$. The second level $e_3$ occurs immediately after $e_4$. Transistor $TR_3$ rapidly turns on in response to this high level second driving signal and the charge stored in the load capacitor is thereby rapidly discharged. Thus, the turn-off delay, including storage time $T_b$ and turn-off time $T_c$, is substantially reduced. When the level of the second driving signal changes to $e_3$, transistor $TR_3$ remains on and a minimal amount of driving is needed in order to maintain it in this state. As shown in FIG. 7(b), the relationship between the levels are:

$$e_4 >> e_3 > 0$$

For example, $e_3$ is +1.5 volts, while $e_4$ is +12.0 volts. The non-zero $e_3$ voltage is maintained even after discharging the load capacitor so that any induced voltage in the load capacitor, caused by the driving of other electrodes, will also be discharged through the emitter-collector of $TR_3$. In other words, the load electrode terminates in a low impedance to drain off any induced charges. In addition, the use of level $e_3$ causes transistor $TR_3$ to switch rapidly from its on state to an off state during the application of the next $e_2$ level of the first driving signal to input terminal 1. Concomitantly, transistor $TR_1$ will rapidly switch during the first driving signal. Using the circuit shown in FIG. 6 and the first and second signals shown in FIGS. 7(a) and (b), turn-on time $T_a$, storage time $T_b$ and turn-off time $T_c$ are substantially shortened as shown in FIG. 7(c). Moreover, like the circuit of FIG. 5, the collector circuit of $TR_3$ flows via resistor $R_{42}$ from the load capacitor when it is being discharged. There is no additional current flow from terminal 4 via $TR_3$ through $TR_1$ when transistor $TR_1$ is on; likewise, when $TR_3$ is on, there is no additional circuit flow from terminal 4 via $TR_3$. Thus, it is not necessary for the high voltage source to supply additional current, rather, it supplies current only during the charging and discharging current.

A separate driving circuit, as shown above, could be used for each electrode, and each of the first and second signals could be independently supplied to each driving circuit. Such a design, however, requires multiple sources to generate the first and second signals for all the driving circuits. The use of multiple sources is very impractical. One possible solution is to use a common source for generating the second driving signals. In that case, however, multiple sources are, nevertheless, needed to generate the complex first driving signals for all the circuits.

Figure 7:
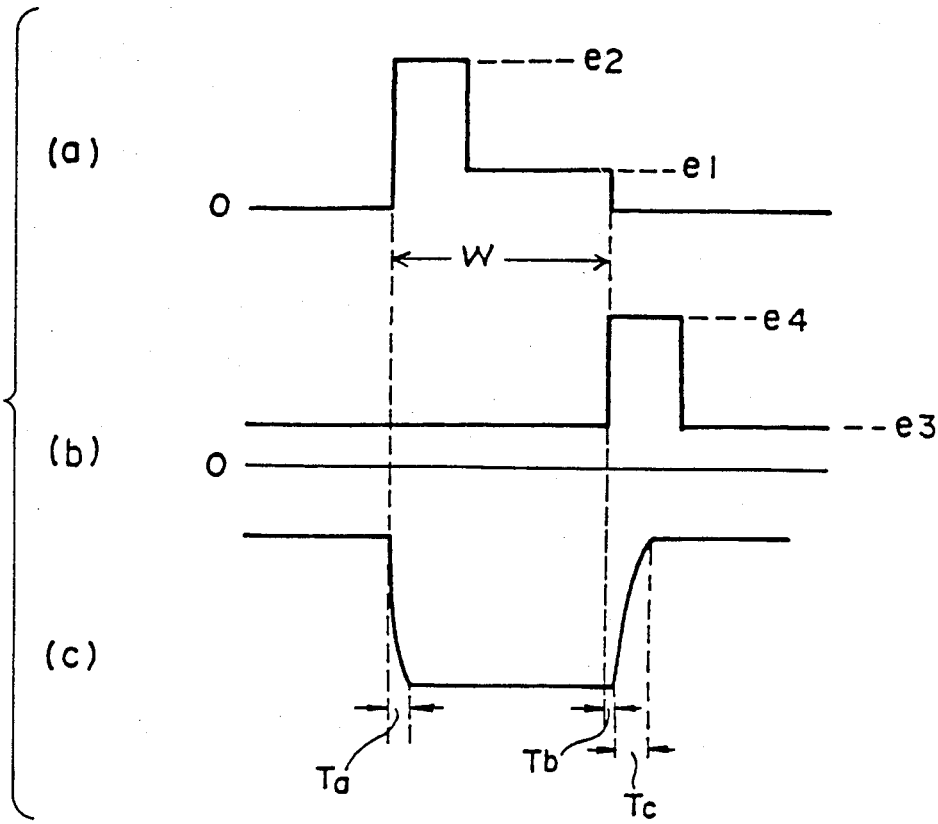
FIG. 7 shows input and output waveforms for the driving circuit shown in FIG. 6 according to the present invention.
Figure 8:
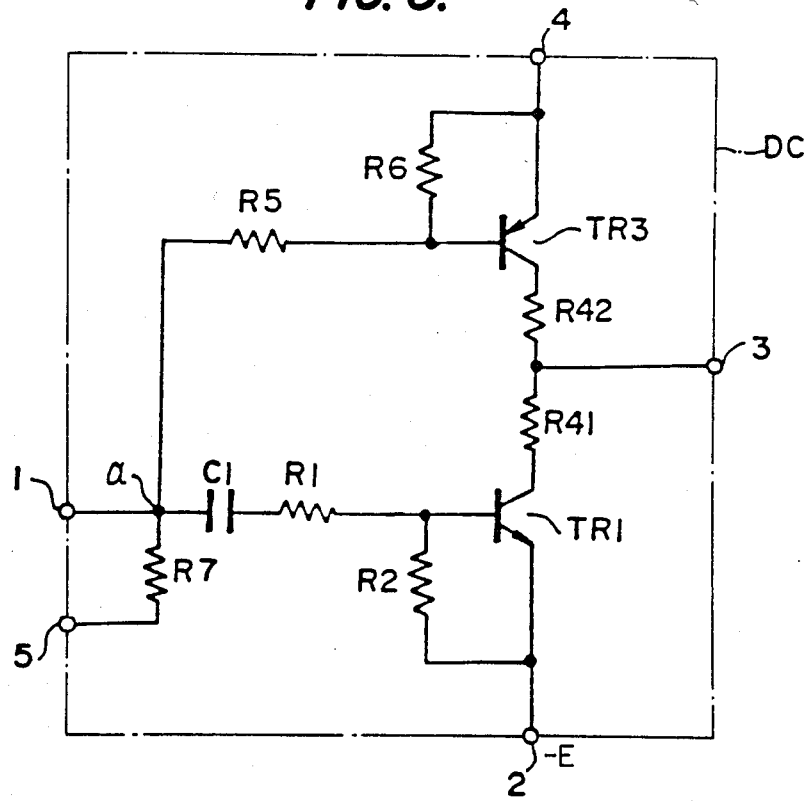
FIG. 8 is a schematic diagram of another embodiment of this invention.
Figure 9:
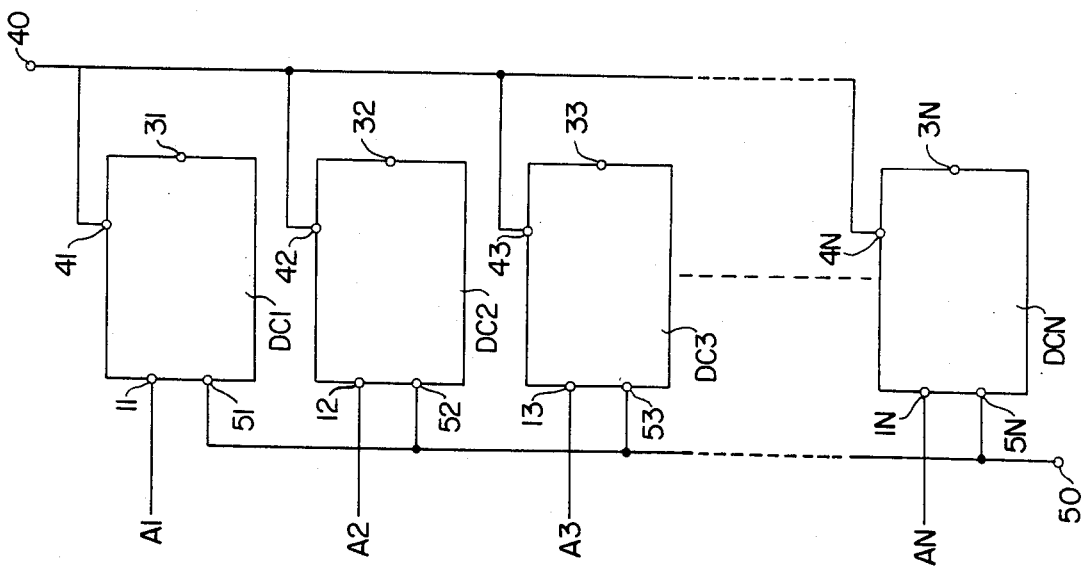
FIG. 9 is a circuit diagram for connecting a plurality of the driving circuits shown in FIG. 8.

Shown in FIGS. 8-9 is an alternative embodiment according to the invention wherein a plurality of driving circuits are coupled together in a manner which permits both the first and second driving signals to be easily generated and appropriately supplied from two respective sources. As shown in FIG. 8, a first input terminal 5 receives the first driving signal and is connected via resistor $R_7$ which is connected to input node a. The second driving signal is supplied to the second input terminal 4 and a third driving signal is supplied to the third input terminal 1. The first and second driving signals are the same signals used for the circuit of FIG. 6, as shown in FIGS. 7a and 7b. In this embodiment, a single source supplies the first driving signals to input terminal 5 of the multiple driving circuits, while a different single source supplies the second driving signals to input terminal 4 of the multiple driving circuits. Third input terminal 1 receives a third driving signal consisting of either a zero level (i.e., shorted or ground) or an open circuit condition. Each respective driving circuit receives a separate third signal depending on whether or not recording signals are to be supplied to the input. If a zero level is supplied to a particular circuit, then the recording signals supplied to input terminal 5 will not be supplied to the base of either $TR_1$ or $TR_3$. If, on the other hand, an open circuit is maintained, then the driving circuit will have the recording signals (i.e., first driving signals) supplied to $TR_1$ and $TR_3$.

According to this embodiment, when the signal applied to input terminal 1 is in an open state, transistor $TR_1$ is overdriven during $e_2$ and minimally driven during $e_1$. When the recording picture signal is completed, transistor $TR_3$ is overdriven by the second driving signals during $e_4$ and minimally driven during $e_3$.

When, on the other hand, the signal applied to input terminal 1 is grounded, transistor $TR_1$ is maintained in an off state and transistor $TR_3$ is maintained in an on state regardless of the signal level of the first driving signal supplied to input terminal 5 and the second driving signal supplied to input terminal 4. Unlike the complex first driving signals, the third driving signals can be easily generated. Consequently, they can be separately generated for each respective driving circuit. In fact, these signals can be generated by coupling a switch across input terminal 1 to ground; opening the switch produces the open circuit condition, while closing the switches produces the ground level. Accordingly, by using separate third driving signals for each driving circuit, the second and third driving signals may be common signals to all driving circuits or, if desired, to certain preselected driving circuits.

Figure 10:
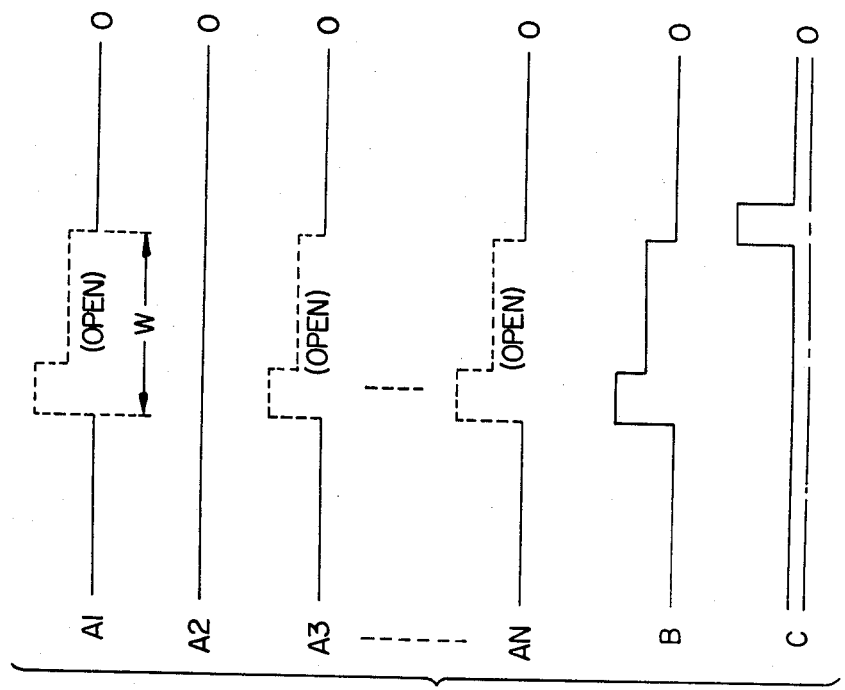
FIG. 10 shows the input waveforms for explaining the circuit shown in FIG. 9.

The interconnection of the driving circuits are more clearly shown in FIG. 9. Shown are N driving circuits (DC1-DCN), each connected via its output terminal 31-3N to a respective electrode. Terminal 41-4N of each driving circuit is connected in common to second common input terminal 40 for receiving the second driving signals, while terminal 51-5N of each driving circuit is connected in common to first common input terminal 50 for receiving the first driving signals. Thus, all driving circuits receive the first and second driving signals from two sources. As shown in FIG. 10, the second driving signals C are supplied to terminal 40, while the first driving signals B are supplied to terminal 50.

As shown in FIGS. 9-10, each driving circuit receives a separate third driving signal depending upon whether recording is to occur at the respective electrode. For example, A1-AN correspond to respective third input terminals 11-1N. FIG. 10 shows an open circuit input for A1 and A3-AN, while a short circuit is shown for A2. In that case, driving circuits DC1 and DC3-DCN will produce output recording output signals while DC2 will not.

In the above-mentioned embodiments, the transistors shown have a polarity and negative voltage source for supplying a negative voltage to the recording electrodes. If desired, however, a positive voltage can be supplied to the recording electrodes by utilizing a positive high voltage source and reversing the polarities of the transistors. Also, FIG. 7 shows that $e_4$ occurs at the end of $e_1$ and continues for a time approximately equal to or greater than TC. It is also possible to design the circuit for $e_4$ to have a width less than TC. In that case, the discharge rate will not be as fact as previously discussed but, in any event, some improvement will be noted.

We claim:

1. A driving circuit for driving an electrostatic recording head with high voltage driving output pulses having a reduced turn-off, storage and turn-off time, comprising:

mutually complementary first and second transistors, each having a base and emitter and commonly interconnected collectors;

a first input terminal, for receiving a first driving signal, coupled to the base of said first transistor and to the base of said second transistor, and means for producing said first driving signal, said first driving signals corresponding to picture signals to be recorded by the recording head and having at least first and second non-zero signal levels during a period of time when the picture signals are supplied to the driving circuit, the first of said non-zero signal levels is the highest and occurs during a beginning portion of said time period;

a second input terminal, for receiving a second driving signal, coupled to the emitter of said second transistor, and means for producing said second driving signal, said second driving signal having at least first and second non-zero signal levels the first non-zero signal level of said second driving signal being higher than the second non-zero signal level of said second driving signal and occuring substantially at an end portion of the second non-zero signal level of said first driving signal;

a high voltage potential source coupled to the emitter of said first transistor; and an output terminal coupled to the interconnection of the collectors of said first and second transistors.

2. A circuit comprising a plurality of driving circuits for driving an electrostatic recording head with high voltage driving output pulses having a reduced trun-off, storage and turn-off time, each driving circuit comprising:

mutually complementary first and second transistors each having a base and emitter and commonly interconnected collectors;

a first input terminal, for receiving a first driving signal, coupled to the base of said first transistor and to the base of said second transistor;

means for producing said first driving signal;

a second input terminal, for receiving a second driving signal, coupled to the emitter of said second transistor;

means for producing said second driving signal;

a third input terminal, for receiving a third driving signal, coupled in parallel with said first input terminal;

a high voltage potential coupled to the emitter of said first transistor;

an output terminal coupled to the interconnection of the collectors of the first and second transistors;

the first driving signal corresponding to picture signals to be recorded by the recording head and having at least first and second non-zero signal levels during a period of time when the picture signals are supplied to the driving circuit, the first of said non-zero signal levels is the highest and occurs during a beginning portion of said time period;

said second driving signal having at least first and second non-zero signal levels, the first non-zero signal level of said second driving signal being higher than the second non-zero signal level of said second driving signal and occuring substantially at an end portion of the second non-zero signal level of said first driving signal and said third driving signal representing either an open circuit condition or a grounded condition.

3. The driving circuit of claim 1 wherein said first driving signal includes a third signal level, said first and second non-zero signal levels and said third signal level sequentially occur during said time period.

4. The driving circuit of claim 3 wherein said third signal level is a zero level signal.

5. The driving circuit of claim 1 wherein said end portion of the second non-zero signal level of said first driving signal occurs at an end portion of said time period.

6. The driving circuit of claim 2 wherein said first driving signal includes a third signal level, said first and second non-zero signal levels and said third signal level sequentially occur during said time period.

7. The driving circuit of claim 6 wherein said third signal level is a zero level signal.

8. The driving circuit of claim 2 wherein said end portion of the second non-zero signal level of said first driving signal occurs at an end portion of said time period.

9. In a driving circuit for producing high voltage driving output pulses for driving an electrostatic recording head, said circuit comprising: mutually complementary first and second transistors, each having a base and emitter and commonly interconnected collectors; a first input terminal, for receiving a first driving signal corresponding to picture signals to be recorded by the recording head, coupled to the base of said first transistor and to the base of said second transistor; a second input terminal, for receiving a second driving signal, coupled to the emitter of said second transistor; a high voltage potential source coupled to the emitter of said first transistor; and an output terminal coupled to the interconnection of the collectors of said first and second transistors; a method of reducing turn-on time, storage time and turn-off time of said high voltage output pulses comprising the steps of:

applying said first driving signal to said first input terminal wherein said first driving signal has at least first and second non-zero signal levels during a period of time when the picture signals are supplied to the driving circuit, the first of said non-zero signal levels is the highest and occurs during a beginning portion of said time period; and, applying said second driving signal to said second input terminal wherein said second driving signal has at least first and second non-zero signal levels, the first non-zero signal level of said second driving signal being higher than the second non-zero signal level of said second driving signal and occuring substantially at an end portion of first driving signal.

* * * * *